United States Patent
Sudoh et al.

(10) Patent No.: US 11,708,645 B2
(45) Date of Patent: Jul. 25, 2023

(54) SIC GROWTH APPARATUS COMPRISED OF A BASE HAVING A PLURALITY OF GRAPHITE PLATES HAVING ANISOTROPY OF A THERMAL EXPANSION COEFFICIENT AND METHOD OF MANUFACTURING A SIC CRYSTAL USING THE APPARATUS

(71) Applicant: SHOWA DENKO K.K., Tokyo (JP)

(72) Inventors: Nobutoshi Sudoh, Inzai (JP); Rimpei Kindaichi, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/646,062

(22) Filed: Dec. 27, 2021

(65) Prior Publication Data
US 2022/0213617 A1 Jul. 7, 2022

(30) Foreign Application Priority Data
Dec. 28, 2020 (JP) .................................. 2020-218649

(51) Int. Cl.
- *C30B 23/02* (2006.01)
- *C30B 29/36* (2006.01)
- *C30B 35/00* (2006.01)
- *C30B 23/00* (2006.01)

(52) U.S. Cl.
CPC ............ *C30B 29/36* (2013.01); *C30B 23/025* (2013.01); *C30B 35/002* (2013.01); *C30B 23/002* (2013.01)

(58) Field of Classification Search
CPC ........ C30B 23/00; C30B 23/002; C30B 23/02; C30B 23/025; C30B 23/06; C30B 29/00; C30B 29/10; C30B 29/36; C30B 35/00; C30B 35/002
USPC ..... 117/84, 88, 94, 101, 106, 200, 204, 911, 117/937, 951
See application file for complete search history.

(56) References Cited

U.S. PATENT DOCUMENTS

2016/0340796 A1* 11/2016 Hori ....................... C30B 33/02

FOREIGN PATENT DOCUMENTS

| JP | 59-182213 A | 10/1984 |
|---|---|---|
| JP | 2004-269297 A | 9/2004 |
| JP | 2008-088036 A | 4/2008 |
| JP | 2016-013949 A | 1/2016 |
| JP | 2016013949 A * | 1/2016 |

* cited by examiner

*Primary Examiner* — Kenneth A Bratland, Jr.

(57) ABSTRACT

A silicon carbide single crystal manufacturing apparatus includes a crucible constituted by a crucible body and a crucible lid; and a base that is placed on the underside of the crucible lid and holds a silicon carbide seed crystal, wherein the base has a structure in which a plurality of graphite plates having anisotropy of the thermal expansion coefficient are laminated and bonded, and when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal.

15 Claims, 3 Drawing Sheets

SIC GROWTH APPARATUS COMPRISED OF A BASE HAVING A PLURALITY OF GRAPHITE PLATES HAVING ANISOTROPY OF A THERMAL EXPANSION COEFFICIENT AND METHOD OF MANUFACTURING A SIC CRYSTAL USING THE APPARATUS

TECHNICAL FIELD

The present disclosure relates to a silicon carbide single crystal manufacturing apparatus and a method of manufacturing a silicon carbide single crystal.

Priority is claimed on Japanese Patent Application No. 2020-218649, filed Dec. 28, 2020, the content of which is incorporated herein by reference.

BACKGROUND ART

Silicon carbide (SiC) has a dielectric breakdown electric field that is one order of magnitude larger and a band gap that is three times larger than those of silicon (Si). Also, silicon carbide (SiC) has characteristics such as a thermal conductivity about three times higher than that of silicon (Si). It is expected that silicon carbide (SiC) will be able to be applied to power devices, high frequency devices, high temperature operating devices and the like. For this reason, in recent years, SiC epitaxial wafers have come to be used for the above-mentioned semiconductor devices.

The SiC epitaxial wafer is manufactured by growing a SiC epitaxial film, which is an active region of a SiC semiconductor device, on a silicon carbide single crystal substrate by a chemical vapor deposition method.

The silicon carbide single crystal substrate is produced by cutting out a silicon carbide single crystal. This silicon carbide single crystal can generally be obtained by a sublimation method. In the sublimation method, a seed crystal consisting of a silicon carbide single crystal is placed on a base placed in a graphite crucible, and the sublimation gas sublimated from the raw material powder in the crucible is supplied to the seed crystal by heating the crucible to grow the seed crystal into a larger silicon carbide single crystal.

In the sublimation method, it is necessary to hold the seed crystal on the base, and an adhesive is generally used for holding the seed crystal. Further, a stress buffering material may be used to relieve the stress (shear stress) generated in parallel with the adhesive surface caused by the difference in thermal expansion between the seed crystal and the graphite base (see, Patent Literature 1).

A local temperature distribution occurs on the surface of the seed crystal due to poor adhesion and tearing of the stress buffering material caused by the above stress when retaining seed crystals. When this temperature distribution is large, macro defects are likely to occur in the single crystal, and there is a problem that the quality of the single crystal is deteriorated.

CITATION LIST

Patent Literature

[Patent Literature 1]
Japanese Unexamined Patent Application, First Publication No. 2004-269297
[Patent Literature 2]
Japanese Unexamined Patent Application, First Publication No. 2008-88036
[Patent Literature 3]
Japanese Unexamined Patent Application, First Publication No. S59-182213
[Patent Literature 4]
Japanese Unexamined Patent Application, First Publication No. 2016-13949

SUMMARY OF INVENTION

Technical Problem

To solve this problem, in Patent Literature 2, a method of suppressing the shear stress generated between the seed crystal and the graphite base by using a member having a thermal expansion coefficient close to that of silicon carbide at room temperature as a member for retaining the seed crystal is proposed. In Patent Literature 3, an isotropic carbon material having anisotropic ratio of 1.01 is obtained by devising a manufacturing method (see, Table 2). However, as an isotropic carbon material having 1.0 to 1.1 is defined as an isotropic carbon material (see, a lower left paragraph in page (3)) in Patent Literature 3, when an isotropic graphite used in the sublimation method, which is commercially available, is measured, it has anisotropic ratio of about 1.0 to 1.1. When the graphite of the base has anisotropy, a large shear stress is generated on the bonding surface between the base and the seed crystal in the direction in which the thermal expansion coefficient of the graphite used for the base is large. In consideration of the anisotropy of isotropic graphite, a method of suppressing the generated stress by aligning with the anisotropy of silicon carbide has also been proposed (Patent Literature 4).

In the sublimation method, members are exposed to a wide temperature range of room temperature to 2400° C. or higher. In this range, it is not easy to more accurately grasp the thermal expansion coefficient of a member having a temperature dependence and to match the thermal expansion coefficient of a silicon carbide single crystal and that of a graphite base in each temperature zone. In addition, an isotropic graphite generally allows anisotropy of about 1.0 to 1.1, and this anisotropy is generally larger than the anisotropy in the plane direction of the silicon carbide seed crystal, and is different from that of the graphite base. For this reason, it is difficult to sufficiently suppress the shear stress generated between the graphite base and the silicon carbide seed crystal over the entire surface.

The present disclosure has been made in view of the above circumstances, and provides a silicon carbide single crystal manufacturing apparatus and a method for manufacturing a silicon carbide single crystal, which can reduce poor bonding between the silicon carbide seed crystal and the graphite base.

Solution to Problem

The present disclosure provides the following means to resolve the above problems.

According to a first aspect of the present disclosure, there is provided a silicon carbide single crystal manufacturing apparatus, including a crucible constituted by a crucible body and a crucible lid and a base that is placed on the underside of the crucible lid and holds a silicon carbide seed crystal, wherein the base has a structure in which a plurality of graphite plates having anisotropy of a thermal expansion coefficient are laminated and bonded, when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal.

In the silicon carbide single crystal manufacturing apparatus according to the first aspect, the anisotropy of the thermal expansion coefficient may be 1.02 or more and 1.20 or less.

In the silicon carbide single crystal manufacturing apparatus according to the first aspect, the plurality of graphite plates may be 2 to 8 plates.

In the silicon carbide single crystal manufacturing apparatus according to the first aspect, the total thickness of the plurality of graphite plates may be 20 mm or more and 100 mm or less.

In the silicon carbide single crystal manufacturing apparatus according to the first aspect, the thickness of each graphite plate constituting the base may be 5 mm or more and 20 mm or less.

In the silicon carbide single crystal manufacturing apparatus according to the first aspect, the thickness of each graphite plate constituting the base may be the same.

According to a second aspect of the invention, there is provided a method of manufacturing a silicon carbide single crystal in which the silicon carbide seed crystal and a silicon carbide raw material are placed in the crucible and a sublimation gas sublimated from the silicon carbide raw material is precipitated on the seed crystal to grow a bulk silicon carbide single crystal, using a crucible constituted by a crucible body and a crucible lid, and a base that is placed on the underside of the crucible lid and holds a silicon carbide seed crystal, wherein the base has a structure in which a plurality of graphite plates having anisotropy of a thermal expansion coefficient are laminated and bonded, and when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal.

In the method of manufacturing a silicon carbide single crystal according to the second aspect, a stress buffering member may be arranged between the seed crystal and the base.

In the method of manufacturing a silicon carbide single crystal according to the second aspect, the outer diameter of the seed crystal may be 150 mm or more.

Advantageous Effects of Invention

According to the present disclosure, it is possible to provide a silicon carbide single crystal manufacturing apparatus capable of reducing poor bonding between a silicon carbide seed crystal and a graphite base.

DESCRIPTION OF EMBODIMENTS

Figure 1:
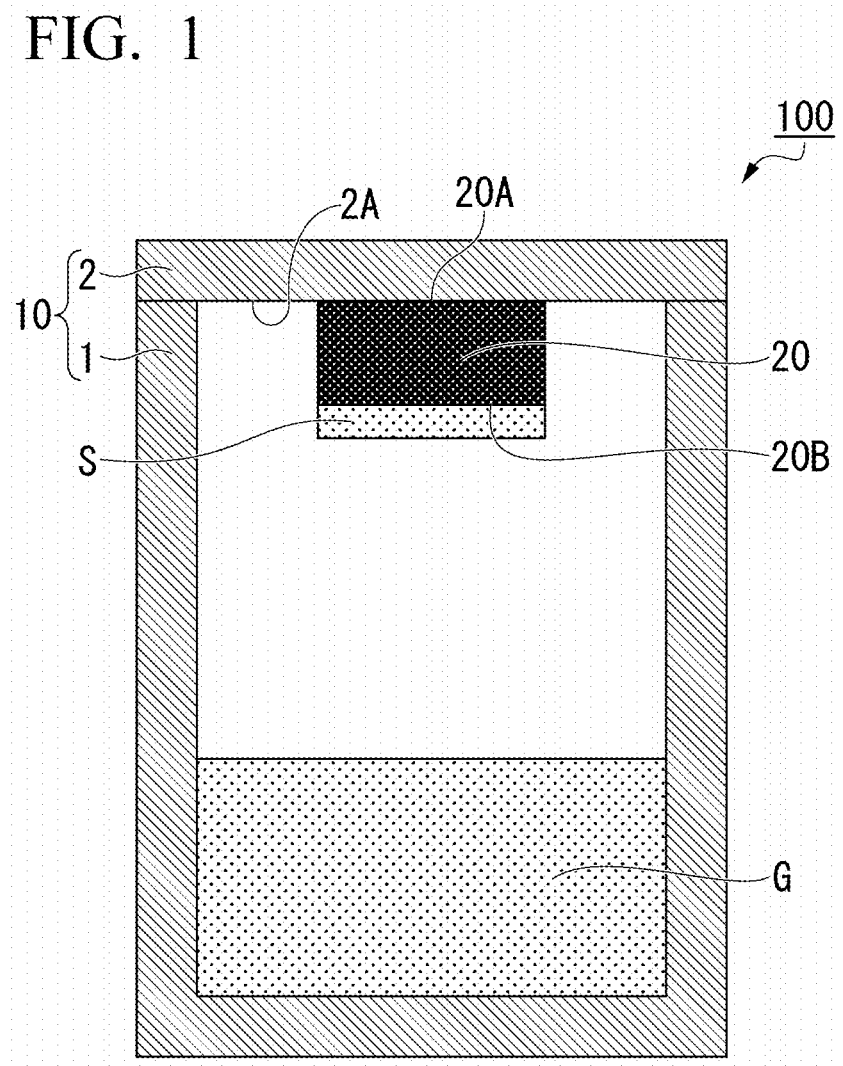
FIG. 1 is a cross-sectional schematic diagram of an example of the silicon carbide single crystal manufacturing apparatus which is one embodiment of the present disclosure.

Hereinafter, embodiments of the present disclosure will be described with reference to the drawings. In each of the following embodiments, the same or equal parts may be designated by the same reference numerals in the drawings. Further, in the drawings used in the following description, the featured portion may be enlarged for convenience in order to make the feature easy to understand, and the dimensional ratio of each component may not be the same as the actual one. Further, the materials, dimensions, etc. exemplified in the following description are examples, and the present disclosure is not limited thereto, and can be appropriately modified and carried out within the range in which the effects of the present disclosure are exhibited.

(Silicon Carbide Single Crystal Manufacturing Apparatus)

Figure 2A:
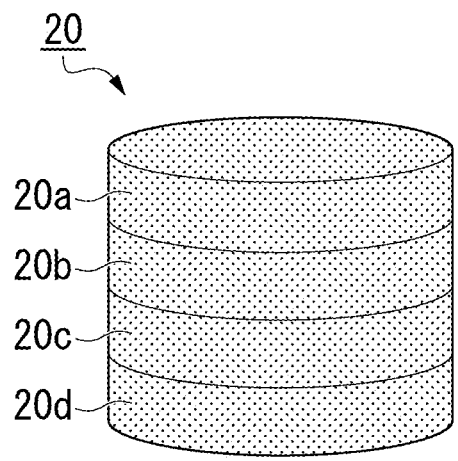
FIG. 2A is a perspective schematic diagram which took out only the base from the silicon carbide single crystal manufacturing apparatus shown in FIG. 1.
Figure 2B:
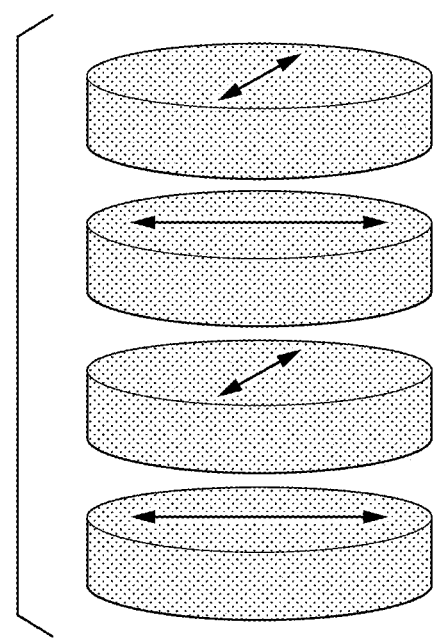
FIG. 2B is a disassembled perspective schematic diagram which arranged four graphite plates separated by each other in order to explain the maximum direction axis of the thermal expansion coefficient shown by each of 4 graphite plates constituting the base.

FIG. 1 is a cross-sectional schematic diagram of an example of the silicon carbide single crystal manufacturing apparatus which is one embodiment of the present disclosure. FIG. 2A is a perspective schematic diagram which took out only the base from the silicon carbide single crystal manufacturing apparatus shown in FIG. 1. FIG. 2B is a disassembled perspective schematic diagram which arranged four graphite plates separated by each other in order to explain the maximum direction axis of the thermal expansion coefficient shown by each of 4 graphite plates constituting the base.

A silicon carbide single crystal manufacturing apparatus 100 shown in FIG. 1 includes a crucible 10 constituted by a crucible body 1 and a crucible lid 2, and a base 20 having a surface 20A on the crucible lid side (the crucible lid side surface) supported by the lower surface 2A of the crucible lid 2 and a seed crystal mounting surface 20B on which the seed crystal S is mounted and which is a surface on the opposite side of the crucible lid side surface 20A, wherein the base 20 has a structure in which a plurality of graphite plates having anisotropy of the thermal expansion coefficient are laminated and bonded, and in the plurality of graphite plates, the maximum directional axes of the thermal expansion coefficient between adjacent graphite plates are orthogonal to each other.

Each of the plurality of graphite plates constituting the base 20 is not isotropic with respect to thermal expansion and has anisotropy of the thermal expansion coefficient, that is, has a thermal expansion coefficient different for each direction. The "maximum direction axis of the thermal expansion coefficient" is an axis indicating the direction showing the maximum linear expansion coefficient among the plurality of linear expansion coefficients.

A heat insulating material (not shown) for keeping the crucible 10 warm and a heating means (not shown) are provided on the outer periphery of the crucible body 1. In FIG. 1, a single crystal growth raw material (raw material powder) G and a seed crystal S are also shown to help understanding.

In the production of the silicon carbide single crystal, the raw material powder G is filled in the bottom of the crucible 10 and the seed crystal S made of silicon carbide is placed on the base 20. The base 20 is located at a position facing the raw material powder. Next, the crucible 10 is heated to about 2100 to 2400° C. in a reduced pressure atmosphere to sublimate the raw material powder G, whereby the sublimation gas (raw material gas) is supplied onto the seed crystal S. The raw material gas sublimated from the raw material powder G is recrystallized on the surface of the seed crystal S, so that the silicon carbide single crystal grows.

<Crucible>

The crucible 10 is a crucible for producing a silicon carbide single crystal by a sublimation method, and includes a crucible body 1 and a crucible lid 2. As long as the crucible body 1 and the crucible lid 2 can form a crystal growth space together, there is no limitation on the shape.

As the crucible 10, for example, one made of graphite can be used. The crucible 10 becomes hot during crystal growth. Therefore, it needs to be made of a material that can withstand high temperatures. Graphite has an extremely high sublimation temperature of 3550° C. and can withstand high temperatures during growth.

When the crucible 10 is made of graphite (graphite material), its surface may be coated with TaC or SiC.

<Base>

The base 20 shown in FIG. 2A has a configuration in which four graphite plates 20a, 20b, 20c, and 20d having anisotropy of the thermal expansion coefficient are laminated and bonded. FIG. 2B shows the maximum directional axis of the thermal expansion coefficient for each of the four graphite plates 20a, 20b, 20c, and 20d.

The arrows illustrated on the four graphite plates 20a, 20b, 20c, 20d indicate the maximum directional axes of the thermal expansion coefficient of the four graphite plates.

As shown in FIG. 2, the four graphite plates 20a, 20b, 20c, and 20d have arrows between adjacent graphite plates are orthogonal to each other, that is, the maximum directional axes of the linear expansion coefficients are orthogonal to each other.

Figure 3:
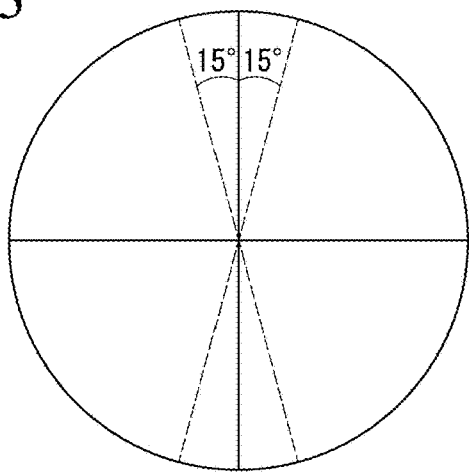
FIG. 3 is a schematic diagram which shows the arrangement relation of the maximum direction axes of the thermal expansion coefficient between the adjacent graphite plates.

The base 20 shown in FIG. 2 has an arrangement in which the maximum directional axes of the linear expansion coefficients of adjacent graphite plates are orthogonal to each other, but may have an arrangement in which the maximum directional axes of the linear expansion coefficients of adjacent graphite plates intersect within an angle range of ±15° from the orthogonality as shown in FIG. 3.

Compared to the arrangement in which the maximum directional axes of the linear expansion coefficients of adjacent graphite plates are orthogonal to each other, if it deviates from the orthogonality, the stress relaxation effect is reduced. However, when the deviation is within the angle range of 15°, a sufficient stress relaxation effect can be obtained, although it depends on the number of graphite plates constituting the base 20.

For example, under the condition of Example 1 described later, when the number of graphite plates constituting the base 20 is 2 or 4, and the deviation between of the maximum directional axes of the adjacent graphite plates is 15°, the stress relaxation effect was 9% and 12%, respectively, compared to the case where the base is integrally formed.

For deviations from orthogonality, it is preferable to use an arrangement in which they intersect within an angle range of ±10°. It is more preferable to use an arrangement in which they intersect within an angle range of ±5°.

The graphite plates constituting the base 20 can be bonded (adhered) to each other by using a carbon adhesive or the like. The carbon adhesive is obtained by dispersing carbon powder in an organic solvent, and they can be bonded (adhered) without impairing the characteristics of the carbon material, by volatilizing the solvent.

The base 20 shown in FIG. 2 is composed of four graphite plates, but the four plates are merely an example. The base 20 may be composed of a plurality of plates. For example, the base 20 may be composed of 2 to 8 graphite plates.

Based on the simulation described later, the shear stress in the base composed of two graphite plates was smaller than the shear stress in the base composed of an integral graphite member. The shear stress in the base composed of four graphite plates was smaller than the shear stress in the base composed of two graphite plates. The shear stress in the base composed of five graphite plates was smaller than the shear stress in the base composed of four graphite plates. The shear stress in the base composed of eight graphite plates was smaller than the shear stress in the base composed of five graphite plates.

From the viewpoint of cost and the like, the number of graphite plates constituting the base 20 is preferably 2 to 4.

It is preferable that all the graphite plates constituting the base 20 are processed from one graphite block. In this case, the variation in the thermal expansion coefficient between the graphite plates becomes small.

The method of producing the base from one graphite block is, for example, (i) a step of hollowing out one graphite block into a solid columnar shape, and (ii) a step of slicing the hollowed out columnar graphite member to divide it into a plurality of graphite plates, (iii) a step of bonding the disk-shaped graphite members divided into a plurality of plates so that the maximum direction axis (maximum axis) of the thermal expansion coefficient is orthogonal to each other in adjacent graphite plates, as shown in FIG. 2.

As the graphite material constituting the graphite plate having various the thermal expansion coefficient are commercially available, a base can be manufactured by appropriately selecting the graphite material.

The graphite material of the graphite plate is preferably a CIP (CIP: Cold Isostatic Press) material. This is because the anisotropy of the thermal expansion coefficient can be reduced by the CIP method.

Although the anisotropy can be reduced by the CIP method or the like, it is difficult to produce a graphite material (block) having no anisotropy due to restrictions on materials.

The anisotropy of the thermal expansion coefficient is preferably 1.02 or more and 1.20 or less.

Here, the "the anisotropy of the thermal expansion coefficient" is the ratio of the maximum thermal linear expansion coefficient to the minimum thermal linear expansion coefficient shown by each graphite plate (maximum thermal expansion coefficient/minimum thermal expansion coefficient).

Although the effect of the present disclosure can be obtained even when the anisotropy is small, it is preferable that the anisotropy is within the range because the generated stress is small when the anisotropy is small.

On the other hand, when the anisotropy is large, the stress applied between the graphite plates during heating becomes large, and the possibility of poor sticking increases here.

The thickness of each graphite plate constituting the base is preferably 5 mm or more and 20 mm or less.

When the thickness of the graphite plate is large, the effect of the present disclosure is small (see Example 1). When the thickness of the graphite plate is small, it takes man-hours and costs to manufacture the base member, so it is preferable to be within this range.

It is preferable that the thickness of each graphite plate constituting the base is the same. This is because the adjacent graphite plates cancel each other out the thermal expansion and the shear stress is suppressed.

It is preferable that the total thickness of the plurality of graphite plates constituting the base is 20 mm or more and 100 mm or less.

When the total thickness is thin, shear stress is unlikely to be applied in the first place, so the effect is small. On the other hand, the effect of the present disclosure is small when the total thickness is thick, especially when one graphite plate is thick. When one graphite plate is small, the number of sheets is large, which is troublesome and costly. Therefore, it is preferable that the range is the same.

The graphite material is preferably made of a graphite material having a Young's modulus of 5 GPa or more at room temperature. This is because it has rigidity that can stably support a silicon carbide single crystal.

The thermal expansion coefficient of graphite (graphite material) constituting the base 20 does not match the thermal expansion coefficient of silicon carbide constituting the seed crystal.

The thermal expansion coefficient of graphite (graphite material) constituting the base 20 does not match the thermal expansion coefficient of silicon carbide constituting the seed crystal in the entire wide temperature range from normal temperature to 2400° C. or higher where the sublimation method is used. Therefore, shear stress is generated at the joint surface (adhesive surface) between the graphite base and the silicon carbide seed crystal. In particular, the expansion difference becomes large in the outer peripheral portion of the seed crystal. When this shear stress becomes large, a gap is formed between the seed crystal and the base due to poor bonding, which leads to the occurrence of macro defects in the crystal.

On the other hand, the base is configured by laminating and adhering a plurality of graphite plates having anisotropy of the linear expansion coefficient in which the maximum directional axes of the thermal expansion coefficient between adjacent graphite plates are orthogonal to each other or the maximum directional axes intersect within an angle range of ±15° from orthogonal in the plurality of graphite plates. By this, in the laminated structure of graphite plates, thermal expansion can be suppressed from each other, and as a result, such shear stress can be suppressed, and macro defects of silicon carbide seed crystals can be reduced.

(Method of Manufacturing Silicon Carbide Single Crystal)

In a method of manufacturing a silicon carbide single crystal in which the silicon carbide seed crystal and a silicon carbide raw material are placed in the crucible and a sublimation gas sublimated from the silicon carbide raw material is precipitated on the seed crystal to grow a bulk silicon carbide single crystal, using a crucible constituted by a crucible body and a crucible lid, and a base that is placed on the underside of the crucible lid and holds a silicon carbide seed crystal, wherein the base has a structure in which a plurality of graphite plates having anisotropy of the thermal expansion coefficient are laminated and bonded, and when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal.

The base and the seed crystal can be adhered (bonded) using a carbon adhesive or the like. The carbon adhesive is obtained by dispersing carbon powder in an organic solvent, and by volatilizing the solvent, it can be adhered (bonded) without impairing the characteristics of the carbon material.

Figure 4:
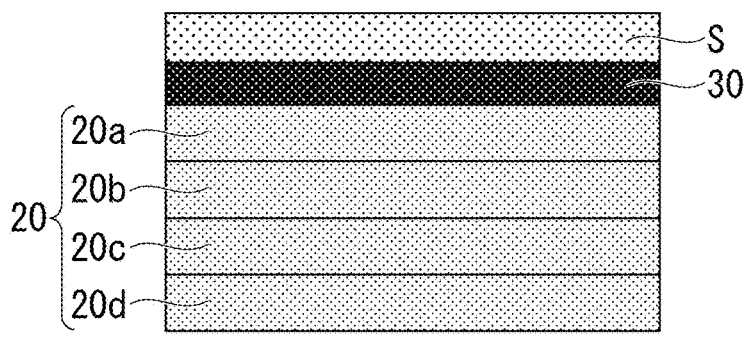
FIG. 4 is a cross-sectional schematic diagram showing the structure in which the stress buffering member is arranged between the seed crystal and the base.

FIG. 4 shows, as an example, a configuration in which the stress buffering member 30 is arranged between the seed crystal S and the base 20 when the base 20 shown in FIG. 2 is used. The stress buffering member may be arranged between the base having another configuration and the seed crystal S.

In this method for manufacturing a silicon carbide single crystal, a stress buffering member (stress buffering layer) arranged between the seed crystal and the base may be used for the purpose of reducing the stress applied to the seed crystal S during growth. By providing the stress buffering member 30 between the seed crystal S and the base 20, such shear stress can be suppressed, and macro defects of the silicon carbide seed crystal can be reduced.

The stress buffering member preferably has a Young's modulus of less than 5 GPa. As the stress buffering member having a Young's modulus of less than 5 GPa, a carbon sheet or the like can be exemplified.

In this method for manufacturing a silicon carbide single crystal, a seed crystal S having an outer diameter of 150 mm or more can be used. Further, those having an outer diameter of 200 mm or more can also be used.

EXAMPLES

Example 1

The configuration shown in FIG. 4 (configuration using a stress buffering member between the silicon carbide seed crystal and the base) was reproduced by simulation, and the shear stress generated at the center height of the stress buffer layer when the temperature was raised was obtained.

General-purpose FEM analysis software ANSYS Mechanical (ANSYS, Inc.) was used for the simulation.

The simulation included a base, a silicon carbide seed crystal, and a stress buffering member, and the simulation was performed on a ¼ symmetric part in order to reduce the calculation load. The simulation conditions are as shown below.

The thickness of silicon carbide seed crystal: 3 mm,
The radius of silicon carbide seed crystal: 80 mm,
The thickness of stress buffering member (layer): 1 mm,
The radius of base: 80 mm,
The thickness of base (overall): 40 mm.

In addition, as the physical property values of various materials, typical values were used as shown in Table 1.

TABLE 1

| MEMBER | SILICON CARBIDE | GRAPHITE BASE | STRESS BUFFERING MEMBER |
|---|---|---|---|
| DENSITY[kg/m$^3$] | 3210 | 1800 | 1000 |
| YOUNG'S MODULUS[Gpa] | 500 | 10 | 1 |
| POISSON'S RATIO[-] | 0.3 | 0.3 | 0.3 |
| THERMAL EXPANSION COEFFICIENT[1/K] | 5.0e−6 | DIRECTION A: 5.5e−6 DIRECTION B: 5.0e−6 | 0.0 |

In Table 1, the direction A is the direction having the maximum thermal expansion coefficient, and the direction B is the direction orthogonal to the direction A.

Regarding the shear stress generated when a temperature of 1000° C., which is the elastic region of the material, was applied to these structures, the shear stress generated in the stress buffer member was evaluated at a position half in the height direction. Assuming that the upper end of the base is adhered to the crucible lid or integrated with the crucible, the condition is to fix the displacement of the base on the side opposite to the seed crystal in the height direction.

Figure 5:
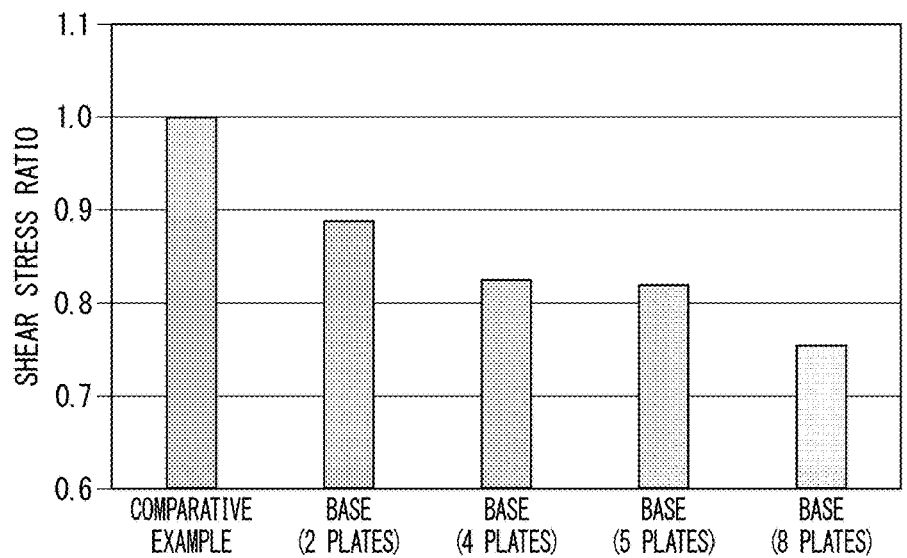
FIG. 5 is the results of simulating the shear stresses when using the conventional base and the bases composed of a plurality of graphite plates.

Based on the above simulation conditions, regarding the case where the base is integrated, the case where the base is composed of two graphite plates, the case where the base is composed of four graphite plates, the case where the base is composed of five graphite plates, and the case where the base portion is composed of eight graphite plates, FIG. 5 shows the result of simulating the maximum shear stress at the evaluation position.

The vertical axis shows the stress ratio with the maximum shear stress at the evaluation position as 1 in the case where the base is integrated.

It can be seen that the shear stress at the evaluation position is reduced by 10% or more in the case where the base is composed of two or more graphite plates.

In the case where the base is integrated, the value of the shear stress is in the range of 1 to 3 MPa, and the suppression of the shear stress of 10% in this range corresponds to 0.1 to 0.3 MPa.

The strength of graphite varies depending on the material, but when a graphite sheet (carbon sheet) having a Young's modulus of less than 5 GPa is used as the stress buffering member, the tensile strength thereof is generally about several MPa. The shear strength is smaller than the tensile strength, and the shear strength is further reduced in a member such as a carbon sheet having anisotropy. Therefore, it is considered that stress suppression of several MPa or less has a sufficient effect on cracks in the stress buffering member.

Example 2

Example 2 is different from Example 1 in that it does not have a stress buffering member (stress buffering layer) between the silicon carbide seed crystal and the base, but other conditions are common.

Regarding the case where the base is composed of two graphite plates, and the case where the base is composed of four graphite plates, a simulation was performed on the maximum shear stress generated between the silicon carbide seed crystal and the base. Regarding the case where the base is composed of two graphite plates, and the case where the base is composed of four graphite plates, a stress relaxation effect of 2% and 4% was obtained, respectively, at the stress ratio with the maximum shear stress at the evaluation position as 1 in the case where the base is integrated.

REFERENCE SIGNS LIST

1: crucible body
2: crucible lid
10: crucible
20: base
20a, 20b, 20c, 20d: graphite plate
20A: crucible lid side surface
20B: seed crystal mounting surface
30: stress buffering member
100: silicon carbide single crystal manufacturing apparatus

What is claimed is:

1. A silicon carbide single crystal manufacturing apparatus, comprising:
    a crucible constituted by a crucible body and a crucible lid; and
    a base that is placed on the underside of the crucible lid and holds a silicon carbide seed crystal,
    wherein the base has a structure in which a plurality of graphite plates having anisotropy of a thermal expansion coefficient are laminated and bonded, and
    when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal,
    wherein the total thickness of the plurality of graphite plates is 20 mm or more and 100 mm or less.

2. The silicon carbide single crystal manufacturing apparatus according to claim 1,
    wherein the anisotropy of the thermal expansion coefficient is 1.02 or more and 1.20 or less.

3. The silicon carbide single crystal manufacturing apparatus according to claim 1,
    wherein the plurality of graphite plates are 2 to 8 plates.

4. The silicon carbide single crystal manufacturing apparatus according to claim 1,
    wherein the thickness of each graphite plate constituting the base is 5 mm or more and 20 mm or less.

5. The silicon carbide single crystal manufacturing apparatus according to claim 1,
    wherein the thickness of each graphite plate constituting the base is the same.

6. A method of manufacturing a silicon carbide single crystal in which a silicon carbide seed crystal and a silicon carbide raw material are placed in a crucible and a sublimation gas sublimated from the silicon carbide raw material is precipitated on the silicon carbide seed crystal to grow the silicon carbide single crystal, using the crucible constituted by a crucible body and a crucible lid, and a base that is placed on the underside of the crucible lid and holds the silicon carbide seed crystal,
    wherein the base has a structure in which a plurality of graphite plates having anisotropy of the thermal expansion coefficient are laminated and bonded, and
    when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal,
    wherein the total thickness of the plurality of graphite plates is 20 mm or more and 100 mm or less.

7. The method of manufacturing the silicon carbide single crystal according to claim 6,
    wherein a stress buffering member is arranged between the silicon carbide seed crystal and the base.

8. The method of manufacturing the silicon carbide single crystal according to claim 6,
    wherein the outer diameter of the silicon carbide seed crystal is 150 mm or more.

9. A silicon carbide single crystal manufacturing apparatus, comprising:
    a crucible constituted by a crucible body and a crucible lid; and
    a base that is placed on the underside of the crucible lid and holds a silicon carbide seed crystal, wherein the base has a structure in which a plurality of graphite plates having anisotropy of a thermal expansion coefficient are laminated and bonded, and when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal, wherein the thickness of each graphite plate constituting the base is 5 mm or more and 20 mm or less.

10. The silicon carbide single crystal manufacturing apparatus according to claim 9,
wherein the anisotropy of the thermal expansion coefficient is 1.02 or more and 1.20 or less.

11. The silicon carbide single crystal manufacturing apparatus according to claim 9,
wherein the plurality of graphite plates are 2 to 8 plates.

12. The silicon carbide single crystal manufacturing apparatus according to claim 9,
wherein the thickness of each graphite plate constituting the base is the same.

13. A method of manufacturing a silicon carbide single crystal in which a silicon carbide seed crystal and a silicon carbide raw material are placed in a crucible and a sublimation gas sublimated from the silicon carbide raw material is precipitated on the silicon carbide seed crystal to grow the silicon carbide single crystal, using the crucible constituted by a crucible body and a crucible lid, and a base that is placed on the underside of the crucible lid and holds the silicon carbide seed crystal, wherein the base has a structure in which a plurality of graphite plates having anisotropy of the thermal expansion coefficient are laminated and bonded, and when viewed in a plan view from the lamination direction, in the plurality of graphite plates, the maximum directional axes of the thermal expansion coefficient between adjacent graphite plates are orthogonal to each other or the maximum directional axes intersect within an angle range of ±15° from orthogonal, wherein the thickness of each graphite plate constituting the base is 5 mm or more and 20 mm or less.

14. The method of manufacturing the silicon carbide single crystal according to claim 13, wherein a stress buffering member is arranged between the silicon carbide seed crystal and the base.

15. The method of manufacturing the silicon carbide single crystal according to claim 13, wherein the outer diameter of the silicon carbide seed crystal is 150 mm or more.

* * * * *